(12) United States Patent
Ashar et al.

(10) Patent No.: US 6,247,164 B1
(45) Date of Patent: Jun. 12, 2001

(54) CONFIGURABLE HARDWARE SYSTEM IMPLEMENTING BOOLEAN SATISFIABILITY AND METHOD THEREOF

(75) Inventors: Pranav Ashar; Sharad Malik; Margaret Martonosi; Peixin Zhong, all of Princeton, NJ (US)

(73) Assignees: NEC USA, Inc.; Princeton University, both of Princeton, NJ (US)

( * ) Notice: Subject to any disclaimer, the term of this patent is extended or adjusted under 35 U.S.C. 154(b) by 0 days.

(21) Appl. No.: 08/919,282

(22) Filed: Aug. 28, 1997

(51) Int. Cl.$^7$ .................................................. G06F 17/50
(52) U.S. Cl. .................................... 716/5; 716/7
(58) Field of Search ................... 395/500.05; 716/18

(56) References Cited

U.S. PATENT DOCUMENTS

| | | | | |
|---|---|---|---|---|
| 5,377,201 | * | 12/1994 | Chakradhar | 371/23 |
| 5,461,573 | * | 10/1995 | Charkradhar | 395/500.04 |
| 5,469,367 | * | 11/1995 | Puri | 716/18 |

OTHER PUBLICATIONS

T. Larrabee, "Efficient Generation of Test Patterns Using Boolean Satisfiability," Stanford University, Feb. 1990.

M. Gokhale, et al., "Building and Using a Highly Parallel Programmable Logic Array," Computer, Jan. 1991, pp. 81–89.

T. Larrabee, "Test Pattern Generation Using Boolean Satisfiability," IEEE Transactions on Computer–Aided Design, vol. 11, No. 1, Jan. 1992, pp. 4–15.

S. Chakradhar, et al., "A Transitive Closure Algorithm for Test Generation," IEEE Transactions on Computer–Aided Design of Integrated Circuits and Systems, vol. 12, No. 7, Jul. 1993, pp. 1015–1028.

P. Athanas, "Processor Reconfiguration Through Instruction–Set Metamorphosis," Computer, Mar. 1993, pp. 11–18.

R. Razdan, et al., "PRISC Software Acceleration Techniques", 1994 IEEE, pp. 145–149.

P. Athanas, et al., "Real–Time Image Processing on a Custom Computing Platform," Computer, Feb. 1995, pp. 16–24.

J. Silva, et al., "GRASP—A New Search Algorithm for Satisfiability," 1996 IEEE, pp. 220–227.

T. Suyama, "Solving Satisfiability Problems on FPGAs".

* cited by examiner

*Primary Examiner*—Matthew Smith
*Assistant Examiner*—Thuan Do
(74) *Attorney, Agent, or Firm*—Sughrue, Mion, Zinn, Macpeak & Seas, PLLC (57) ABSTRACT

Disclosed is a configurable hardware system and method for implementing instance-specific (per-formula) SAT-solver circuits. A template design is provided for producing these circuits on a per-formula basis. The typical hardware requirements for implementing the invention makes the design amenable to current or next-generation FPGA implementation. Hardware simulations indicate that for many difficult SAT problems, the system according to the invention can offer one to three orders of magnitude speedup over prior art software implementations.

15 Claims, 8 Drawing Sheets

$(a+\bar{c})(b+\bar{c})(\bar{a}+\bar{b}+c)(b+d)(\bar{b}+\bar{d})(d+\bar{e})(a+\bar{e})(\bar{a}+\bar{d}+e)(c+f)$
$(\bar{e}+f)(c+e+\bar{f})(\bar{g}+h)(\bar{e}+h)(g+e+\bar{h})(\bar{c})(g)(f+h)(\bar{f}+\bar{h})$

CONFIGURABLE HARDWARE SYSTEM IMPLEMENTING BOOLEAN SATISFIABILITY AND METHOD THEREOF

BACKGROUND OP THE INVENTION

1. Field of the Invention

The present invention relates to a configurable hardware system implementing Boolean satisfiability (SAT) and method therefor. More specifically, the present invention relates to a field-programmable gate array (FPGA) system operable to obtain a solution set for a SAT problem, and method for using the FPGA system to derive the solution set.

2. Description of the Related Art

The Boolean satisfiability problem lies at the core of many synthesis and verification applications. Therefore, software approaches for accelerating the solution process have been studied extensively. Often, however, particular SAT problems pose computational difficulties for even the most aggressive software approaches. Accordingly, it is desirable to discover new systems and methods for solving complex SAT problems efficiently and rapidly.

Software implementations of SAT have been used to accelerate the solutions of a wide range of problems in synthesis, verification, automatic test pattern generation (ATPG), cryptology, and other fields. Some examples are discussed in S. Chakradhar, V. Agrawal, and S. Rothweiler, *A Transitive Closure Algorithm for Test Generation*, IEEE Transactions on Computer-Aided Design of Integrated Circuits and Systems, 12(7):1015–1028, July 1993; T. Larrabee, *Efficient Generation of Test Patterns Using Boolean Satisfiability*, PhD thesis, Stanford University, February 1990; and T. Larrabee, *Test Pattern Generation Using Boolean Satisfiability*, IEEE Transactions on Computer-Aided Design, volume 11, pages 4–15, January 1992. Such software implementations of SAT rely on a backtracking algorithm and other search-space-reducing techniques to explore different possible variable settings, and to determine the implications of these variable settings on the rest of the problem. These methods expand the set of problems for which solutions can be generated in acceptable runtimes. However, for many cases, the prior art software methods are still too slow and at times may have to be aborted before a solution has been obtained.

In order to fully appreciate the present invention, one must have an understanding of SAT and, therefore, it is assumed that the reader is familiar with SAT and with prior art software methods for its implementations. Nevertheless, a short review of SAT and software implementations is provided herein. Additionally, throughout the specification, references are made to various publications describing SAT and prior art software implementations.

Boolean satisfiability (SAT) is a method for finding variable values that satisfy a Boolean formula typically provided in a conjunctive normal form (CNF), i.e., a product of sums. That is, the formula is expressed as an AND of m clauses, each of which is the disjunction (i.e., OR) of one or more literals. Hereinafter, variables (or their complements) taking on an assigned value (1 or 0) are referred to as literals, while a disjunctive expression of literals is referred to as a clause. An x-clause is a clause having x variables. Thus, a set of m clauses defines the SAT in CNF, such as, for example, the set of the two 3-clauses $(a+b+d)$ $(\overline{a}+\overline{b}+\overline{d})$. Here $\overline{b}$ is the complement of b.

As discussed in Larrabee cited above, any Boolean satisfiability problems for Boolean formula or circuit can be converted to one for the conjunctive normal form. Those well versed in the art will recognize this as one of several equivalent ways of doing this conversion. Thus, our methods apply to Boolean formulas or circuits in any original form.

According to the prior art methods, the SAT-solver uses a systematic backtracking procedure to obtain a variable assignment for which the CNF formula evaluates to 1. The efficiency of this approach derives from the fact that dependencies between variables can be extracted readily by the nature of the CNF representation. For example, the requirement that the set $(b+d)$ $(\overline{b}+\overline{d})$ evaluate to 1 creates a dependency between the variables b and d, so that d equals to the complement of b. Derivation of such local dependencies allows rapid derivation of non-local dependencies between variables.

The ability to capture non-local implications efficiently, in turn, allows contradictions in variable assignments during the backtracking procedure to be determined rapidly and early. That is, if during variable assignment it is noted that one dependency implies that a=1 and another dependency implies that a=0, then we have a contradiction, i.e., our variable assignment will not lead to a solution and we need to change the assignment.

A number of efficient algorithms have been proposed for SAT in the recent past. For example T. Larrabee, cited above, emphasized the advantage of SAT-based algorithms for automatic test pattern generation (ATPG). Significant enhancements to the basic SAT algorithm are described in S. Chakradhar et al., cited above, and in J. Silva and K. Sakallah, *GRASP-A New Search Algorithm for Satisfiability*, IEEE ACM International Conference on CAD-96, pages 220–227, November 1996 and P. Stephan, R. Brayton, and A. Sangiovanni-Vincentelli, *Combinational Test Generation Using Satisfiability*, IEEE Transactions on CAD, Vol. 15, No. 9, Pg 1167–1176, September 1996. In particular, Chakradhar et al. proposed techniques for efficiently deriving and using non-local implications, equivalences and contrapositives. On the other hand, Silva et al. proposed one key advance: a technique for realizing nonlinear backtracking in the SAT solver.

The means of expressing a problem in a conjunctive normal form differ depending on the problem domain. Once the problem has been mapped into the CNF formula, the SAT solver searches for a satisfying assignment for the variables of the CNF. Overall, the solution approach is to assign values to variables one by one, and determine whether their implications on the rest of the clauses in the formula leads to a contradiction. When variables have been assigned to all the variables and the CNF evaluates to one, the SAT has been solved.

However, if an assignment of a particular variable leads to a contradiction, the assignment needs to be changed, or the algorithm needs to backtrack and change a previous assignment(s). More specifically, if a contradiction occurs before the procedure is begun, it indicates that the CNF is unsolvable. If a contradiction occurs after some partial assignments, it indicates that the search can be stopped at that point for these partial assignments. That is, we know that some of the values assigned to variables are leading to a nonsensical solution.

Each step of the backtracking procedure involves two sub-parts. First, a variable to branch on is chosen and is assigned a value. Then the CNF formula is repeatedly updated based on the implications of this variable value until a stopping point is reached, i.e., all the implications have been satisfied or a contradiction occurred. If the second step leads to a contradiction, the search can be stopped at this point and the algorithm can backtrack.

In choosing a value for a variable, there are three possibilities: (a) it may have no value assigned to it at the point the choice is made, (b) the algorithm may be backtracking on the first assignment to the variable, or (c) the algorithm may be backtracking on the second assignment to the variable. In case (a) the algorithm can choose to assign either value (1 or 0) to the variable. In case (b), the algorithm must assign a value that is the opposite of the previous assignment. In case (c) the algorithm must backtrack to the previous variable in the search tree. The algorithm completes when either all the clauses are satisfied or when the search space is exhausted.

Various heuristics can be used to pick the next variable and value to branch on. A common strategy is to pick the literal that occurs in the largest number of clauses.

Figure 1:
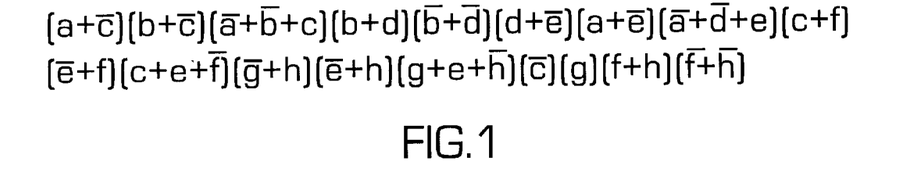
FIG. 1 is an exemplary CNF formula.

Consider the example in FIG. 1 for which we need to determine a vector of satisfying assignments. One method of finding such a vector is described below.

Figure 2A:
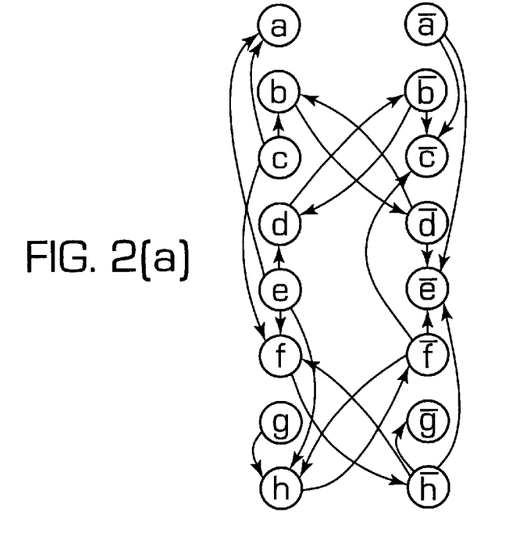

Starting from the given clauses of the CNF formula, a data structure is first built, indicating dependencies between literals arising from the 2-clauses. This is illustrated in FIG. 2(a). This data structure will be used to check for implications and contradictions.

Also before beginning the branch-and-bound procedure, values corresponding to the 1-clauses are imposed. We impose the value $\bar{c}=1$ in the 1-clause shown in FIG. 1. As a result, some clauses may get satisfied and can be removed from the formula, and some clauses may get smaller, possibly creating new 1 and 2-clauses in the process. The creation of new 2-clauses leads to new dependencies, and the creation of new 1-clauses leads to new values that can be imposed. The process is repeated until no more changes to the CNF formula are possible.

For the example of FIG. 1, we use the initial condition to derive:

$$c=0, g_g=0 \rightarrow h_h=1 \rightarrow f=0 \rightarrow e=0$$

Consequently, the remaining clauses are:

$(\bar{a}+\bar{b})$ $(b+d)$ $(\bar{b}+\bar{d})$ $(\bar{a}+\bar{d})$

With the resulting new dependencies:

$(\bar{a}+\bar{b})$ $(\bar{a}+\bar{d})$

When all the 1-clauses have been removed by assigning values to the variables, the remaining clauses can be inspected to determine the literal occurring in the largest number of clauses. A value is imposed on the selected variable and the various derived relationships are used to determine the values of all the variables related to the selected variable.

Figure 2B:
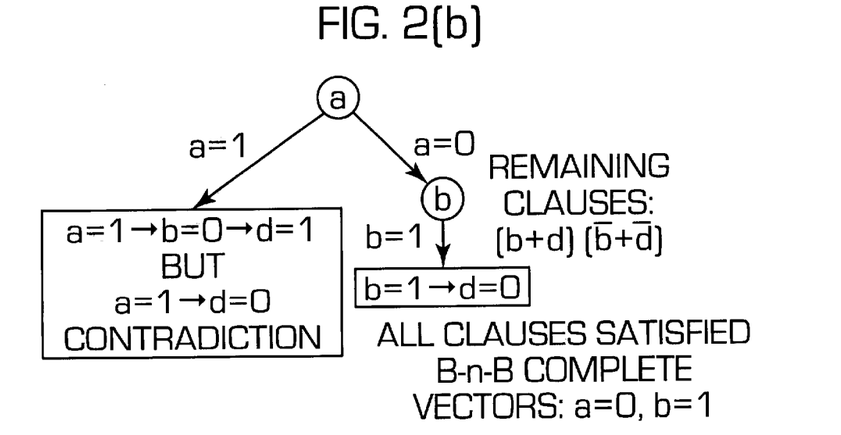

The execution of this procedure is shown in FIG. 2(b). In this example, the solver first attempts to set the variable a to 1, but it immediately runs into a contradiction by tracing the dependencies transitively on the dependency graph. As a result, it tries the value 0 for the variable a, and finds the satisfying assignment: a=0, b=1.

In more detail, assume the solver first selects the variable a and imposes on it the value 1. Then, from the dependencies, i.e., $(\bar{a}+\bar{b})$, it notes that a=1 implies that b=0, and from (b+d) it notes that b=0 implies d=1. However, from $(\bar{a}+\bar{d})$ it also notes that a=1 implies d=0, which contradicts d=1 from above. Therefore, it must backtrack and change the assignment of a from 1 to 0. This implies that b=1 (from $(a+\bar{b})$). Assigning the value 1 to the variable b, it solves (b+d) $(\bar{b}+\bar{d})$ to find that d=0, which agrees with $(\bar{a}+\bar{d})$. Thus, the assignments a=0 and b=1 satisfies the CNF, i.e., the vector (0,1) is a proper solution to the SAT problem of this example.

Another field of technology which is related to the invention is that of field-programmable gate arrays (FPGA). FPGAs have been an important sector of the integrated circuit market for some time. Traditionally, they have primarily been used for hardware prototyping and design emulation. More specifically, chip designers have been using various FPGA based systems to test their designs and determine their correctness. Such systems include, for example, emulation boards marketed by Aptix, Zycad and Quickform, and reconfigurable computing cards marketed by DEC, Annapolis Microsystems, Altera, Virtual Computing Corp. and Xilinx.

In recent years, however, increasing research interest has focused on using programmable hardware technology for customized computing, rather than just verification of designs. Notable works include P. Athanas and L. Abbott, *Real-Time Image Processing on a Custom Computing Platform*, IEEE Computer, 28(2):16–24, February 1995; P. M. Athanas and H. F. Silverman, *Processor Reconfiguration Through Instruction-Set Metamorphosis*, IEEE Computer, March 1993; P. Bertin, D. Roncin, and J. Vuillemin, Introduction to *Programmable Active Memories*, Technical Report 3, DEC Paris Research Lab, June 1989; P. Dunn, *A Configurable Logic Processor for Machine Vision*, Field Programmable Logic and Applications, FPL '95, pages 68–77, August 1995; M. Gokhale, W. Holmes, A. Kopser, et al., *Building and Using a Highly Parallel Programmable Logic Array*, IEEE Computer, 24(1):81–89, January 1991; C. Iseli and E. Sanchez, Spyder: *A SURE (Superscalar and Reconfigurable) Processor*, Journal of Supercomputing, 9(3):231–252, March 1995; C. Jones, J. Oswald, B. Schoner, and J. Villasenor, *Issues in Wireless Video Coding using Run-time-reconfigurable FPGAs*, FCCM '95, April 1995; R. Razdan, K. Brace, and M. D. Smith, *PRISC software acceleration techniques*, Proc. Int'l Conf. on Computer Design, pages 145–149, October 1994; N. Shirazi, A. Walters, and P. Athanas, *Quantitative Analysis of Floating Point Arithmetic on FPGA Based Custom Computing Machines*, FCCM '95, April 1995. Such work involves identifying computationally-intensive portions of certain applications, and accelerating these portions by implementing them on a computing platform whose characteristics have been specialized for their particular computational requirements.

Using a high level hardware description language (HDL) users can design logic circuits automatically for implementation on FPGAs. Thus, in order to solve a specific problem fast and efficiently, users may opt to design a "problem-specific" specialized logic circuit to solve that particular problem, rather than use a general purpose computer. The problem specific logic circuit would emulate the problem to be solved, and would provide solutions depending on the input data provided.

In general, there are several application characteristics that make a problem amenable to a configurable hardware implementation. These include (i) limited bit-width computations, (ii) computations with frequent logical operations, and (iii) problems with more instruction-level parallelism than available in current microprocessors. These characteristics make the applications easy to map to configurable hardware, and accentuate the differences between a general-purpose processor and a configurable implementation. Boolean satisfiability is thus a promising application because it requires performing a large number of potentially-parallel logical operations.

Although configurable hardware designs are quite flexible and diverse, there are several FPGA characteristics that help shape the designs overall. First, FPGAs are made up of many repeated design elements often referred to as Configurable Logic Blocks (CLBs). The size and makeup of the CLB depends on the maker and product line of the FPGA, but they typically contain a small number of flip-flops and are able to form logic functions of roughly 3–9 inputs.

The CLBs in an FPGA are interconnected via a routing network. Most FPGAs have mechanisms for both near-neighbor as well as non-local communication between CLBS. Since non-local communication may increase computation time, most configurable applications attempt to exploit local routing connections by requiring mainly near-neighbor communication between blocks of the circuit. Some FPGA architectures also have mechanisms for using longer routing wires to form wired-logic between many CLB outputs. These mechanisms are particularly useful when an application requires large-input OR or AND gates.

One method for using FPGA to implement SAT is disclosed by T. Suyama, M. Yokoo, and H. Sawada, *Solving Satisfiability Problems on FPGAS*. 6th Int'l Workshop on Field-Programmable Logic and Applications, September 1996. Suyama et al. teach to create on an FPGA a logic circuit corresponding to the SAT problem to be solved, and to apply a vector (consisting of value assignments to all the variables simultaneously) to check all the constraints concurrently. More specifically, Suyama defines a vector consisting of n-digit binary value to represent the assignments of all the variables concurrently, so that the value assignment of the $a_i$ variable is represented by the $i^{th}$ digit of the binary value. This vector is applied to the FPGA and the output of the FPGA is checked to determine whether the vector is a solution. Accordingly, the system of Suyama does not develop the dependencies between the variables and does not perform a branch and bound process.

As can be appreciated, in its exhaustive form, the algorithm of Suyama et al. sequentially increments the n-digit binary value and simultaneously checks whether all the clauses are satisfied. If all the clauses are satisfied, the binary value is recorded as a solution. In its more efficient form, the algorithm of Suyama et al. increments the variable with the lowest index included in the unsatisfied clauses so as to reduce the search space. Thus, Suyama basically maps the problem onto the FPGA and tries various values to check whether they correspond to a solution. This is similar to one trying to unlock a combinational lock by exhaustively trying different numbers until the lock opens.

However, the algorithm of Suyama visits a very large number of states before arriving at a solution (reportedly three to eight times the number of states visited by the comparative Davis-Putnam procedure M. Davis, H. Putnam, "A Computing Procedure for Quantification Theory" Journal of the ACA, Vol. 7, Pages 201–215, 1960). Additionally, it is unclear if and how various heuristics and dynamic ordering schemes used to prune the search space can be implemented in the algorithm of Suyama et al. so as to increase its efficiency so as to provide rapid solutions to complex problems. Importantly, the complexity of implementing the method of Suyama rapidly increases with the complexity of the problem to be solved.

SUMMARY OF THE INVENTION

As noted above, prior art algorithms implementing SAT may take unacceptably long time to solve a complex problem. on the other hand, the characteristics of SAT appear to make it amenable to a configurable hardware implementation. Accordingly, it is an object of the subject invention to provide a mechanism for implementing SAT using configurable hardware.

More specifically, it is an object of the present invention to provide an FPGA system configured for rapidly solving an instance specific SAT problem.

Another object of the subject invention is to provide a method for solving SAT problems using FPGA systems.

BRIEF DESCRIPTION OF THE DRAWINGS

Other objects and advantages of the present invention will become apparent from the following description of the preferred embodiment with reference to the drawings, in which:

FIG. 2(*a*) is a diagram indicating dependencies between literals arising from the 2-clauses derived for the example of FIG. 1.

FIG. 2(*b*) is a schematic illustrating the execution of the procedure for determining a solution to the CNF formula of the example of FIG. 1.

FIG. 3(*a*) is a logic diagram illustrating the basic combinational logic circuit for deriving implications for a simple illustrative example according to an embodiment of the present invention.

FIG. 3(*b*) is a logic diagram of a combinational logic for a per-fault SAT implementation according to an embodiment of the present invention.

FIG. 3(*c*) is a logic diagram of a combinational logic for a SAT implementation according to the preferred embodiment of the present invention.

FIG. 3(*d*) is a logic diagram of a combinational logic for a SAT implementation, which is a simplified version of that depicted in FIG. 3(*c*).

DETAILED DESCRIPTION OF THE PREFERRED EMBODIMENT

According to the preferred embodiment of the present invention, a block of configurable hardware is used to implement a circuit for SAT-solving a particular problem. Such hardware may be any one of the emulation boards and reconfigurable computing cards mentioned above. It should be noted that it is easier to connect and set up communication between a reconfigurable computing cards and a work station. However, because of their currently limited number of FPGA's, for a convoluted problem it may be preferable to use an emulation board instead. Regardless of which device is used, the hardware is configured in an instance specific manner, i.e., each configuration is set for solving a particular instance of a SAT problem.

For a better understanding of the hardware arrangement, the hardware design according to the preferred embodiment is described in the following as two parts: (i) the implication circuitry for the CNF, and (ii) the state machine that manages the algorithm's branch-and-bound exploration of the space using the implication circuitry. However, it should be understood that both parts are generated automatically as a single device, i.e., an emulation board or a reconfigurable computing card, based on the CNF SAT formula. That is, the circuit configuration is derived on a general purpose computer, and is downloaded onto the emulation board or the reconfigurable computing card to reconfigure the FPGA.

(i) The Implication Circuitry For The CNF

Figure 3A:
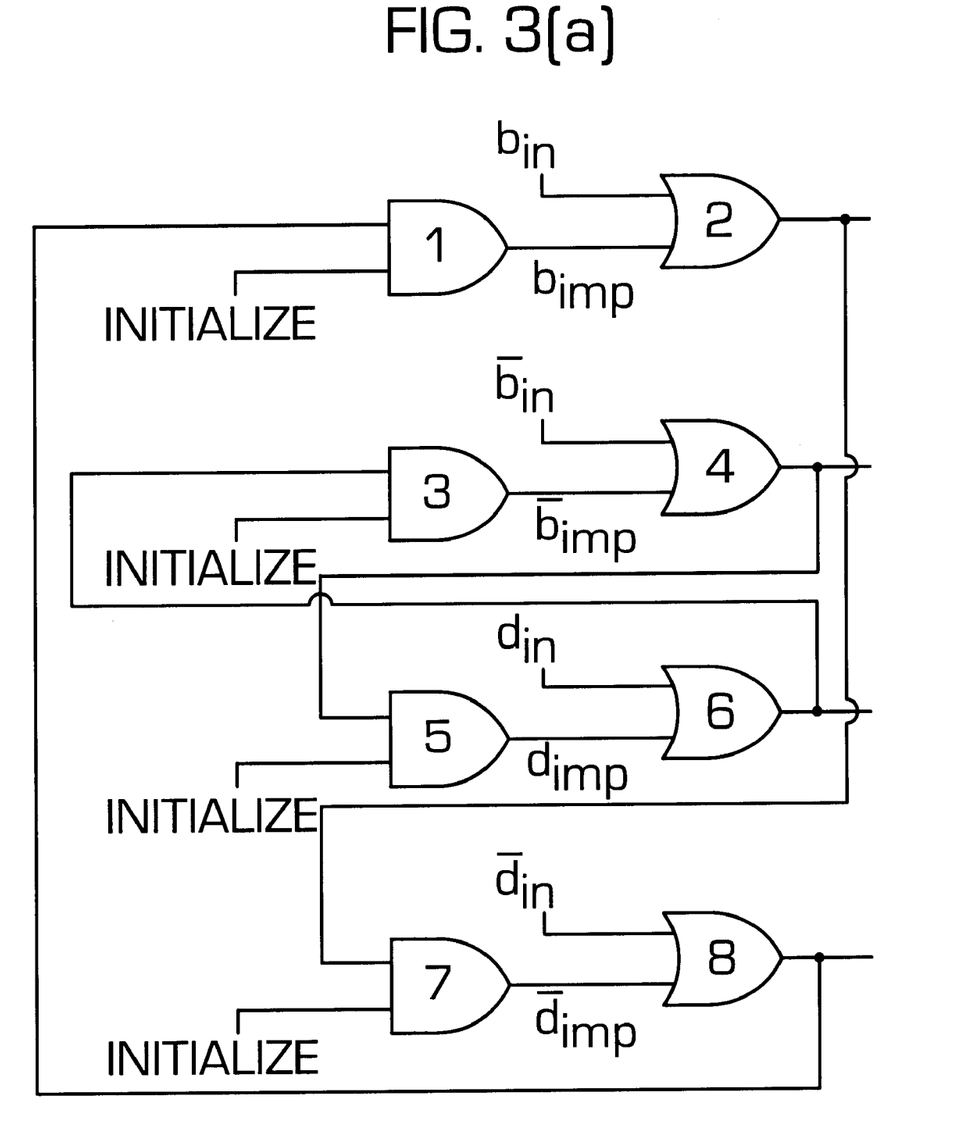

FIG. 3a depicts a basic implication circuitry for the relationships of the variables of the two 2-clauses (b+d) ($\bar{b}$+$\bar{d}$). The basic entity in this circuit is the value taken by each literal in the formula, where a literal may be defined as a positive or negative polarity instance of a variable. For example, a variable v can appear in the formula either as the literal v or as the literal $\bar{v}$. Given a variable v in the formula, if the literal pair (v,$\bar{v}$) in the circuit has the value (0,0), the variable v has no value assigned to it either by implication or by assertion in the branch-and-bound. If it has the value (1,0) or (0,1), the variable v is understood to have the value 1 or 0, respectively. Finally, if (v,$\bar{v}$) takes the value (1,1), we have a contradiction since the variable v cannot take the values 1 and 0 simultaneously.

As can be understood from the Figure, the basic circuit comprises blocks of gates which repeat for each variable and its complement. Each block includes an AND gate which received an initialization signal and a signal which is an output of a related variable (block). For example, AND gate 1 of variable b receive the output of OR gate 8 of variable $\bar{d}$. This is because d=0→b=1. Therefore, $\bar{d}$=1→b=1. Consequently, the output of each AND gate is the implied value of the variable or complement.

Each block also includes an OR gate which receives the implied value, and an asserted value. For example OR gate 2 receives the implied value $b_{imp}$ sent from the AND gate 1, and the asserted value $b_{in}$. This general pattern is repeated for the remaining variables and complements to capture all the dependencies implied by the two 2-clauses.

To illustrate the example from another point of view, assume that after initialization the system sets $b_{in}$=1. Then the output of OR gate 2 would be 1, and will subsequently be input to AND gate 7 of the complement $\bar{d}$. This will imply that $\bar{d}$ also equals 1. This agrees with the relationship between b and $\bar{d}$ as described in the preceding paragraph. However, one must also verify that a contradiction does not occur, that is, that each variable and its complement do not assume the same value. This is illustrated in the next embodiment of FIG. 3b.

In operation of any of the embodiments described herein, all literals are initially set to 0. After one clock cycle, the Initialize input is set to 1. Consequently, in subsequent steps, the value of a literal becomes 1 if it is asserted to be 1 by the branch-and-bound (e.g., $b_{in}$=1) or if it is implied to be 1 as a result of the values of other literals (e.g., $b_{imp}$=1). Each clause that a literal appears in gives rise to one more way in which the literal can be implied to 1. The final value of a literal is the Boolean OR of the different ways in which it can be implied to 1.

Figure 3B:
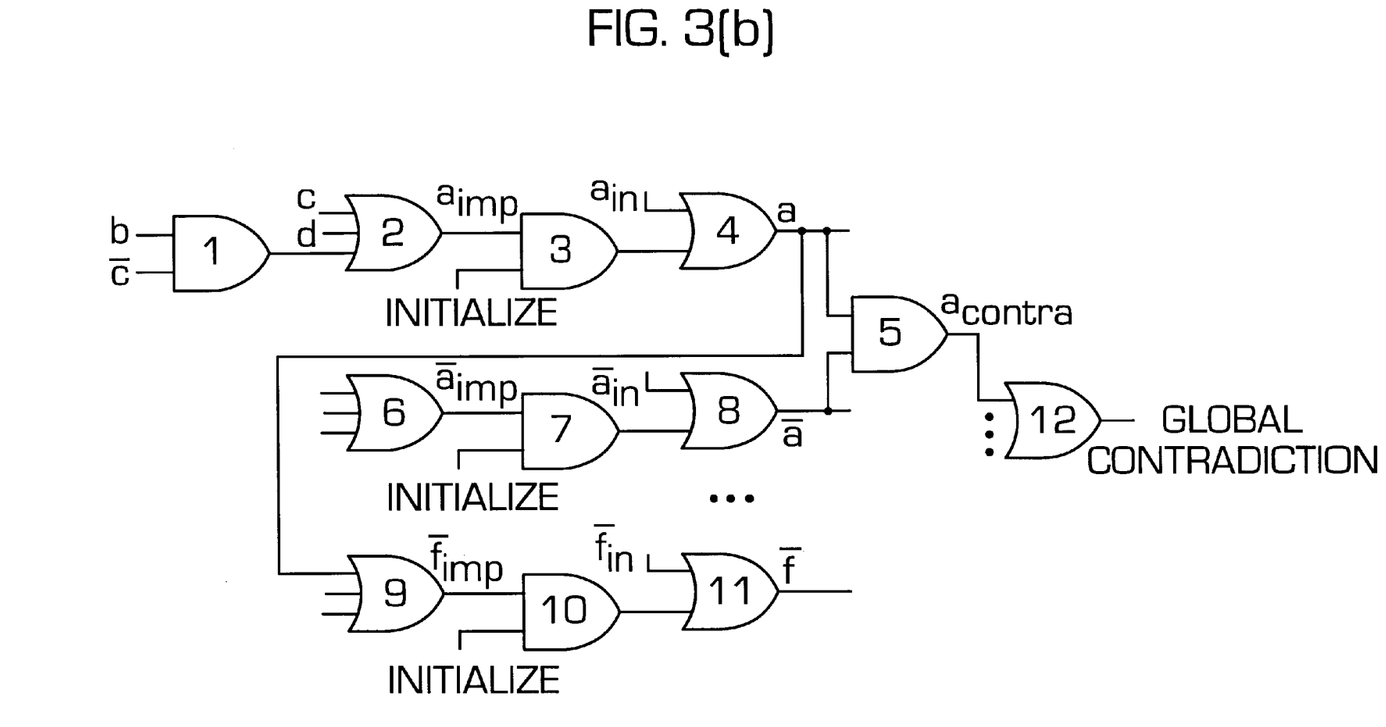

FIG. 3b depicts an embodiment of an implication circuitry according to an embodiment of the present invention. The role of this circuit is also to encapsulate the relationships between variables arising from the clauses in the CNF formula; however, additional elements have been added to enable detection of a variable and its complement assuming the same value.

In the example of FIG. 3b, gates 1 and 2 implement the logic for determining the implied value of the literal a in the CNF formula ($\bar{c}$+a) ($\bar{d}$+a) ($\bar{b}$+c+a). As can be understood from the drawing or the CNF formula, the literal a must take the value 1 if either the literal c has the value 1, or the literal d has the value 1, or if the literals b and c simultaneously have the value 1 0 respectively.

The output of gate 4 in FIG. 3b is the final value taken by literal a. As shown, it is a function of $a_{in}$ (the asserted value), $a_{imp}$ (the implied value), and the initial value. A value is similarly computed for the complemented literal $\bar{a}$. AND gate 5 is provided to check whether a contradiction exists between the assignments of a and $\bar{a}$, i.e., whether both literals have been assigned the value 1. If both values have been assigned the value 1, $a_{contra}$ will also assume the value 1. Similarly, gate 12 is provided to generate a global contradiction signal, by ORing all the individual contradiction signals. The general configuration of gates 2–8 provides the template that is repeated for each variable and its complement in the CNF formula.

The value of a as output from gate 4 is also sent to gate 9 to indicate the value of $\bar{f}_{imp}$, as implied by the value of a. Of course, the ultimately implied value of $\bar{f}_{imp}$ is determined from the values of the other inputs to gate 9 as well. In a similar manner, the final value of each variable and its complement are used to supply the implied value of other variables and their complement according to the CNF formula.

Figure 3C:
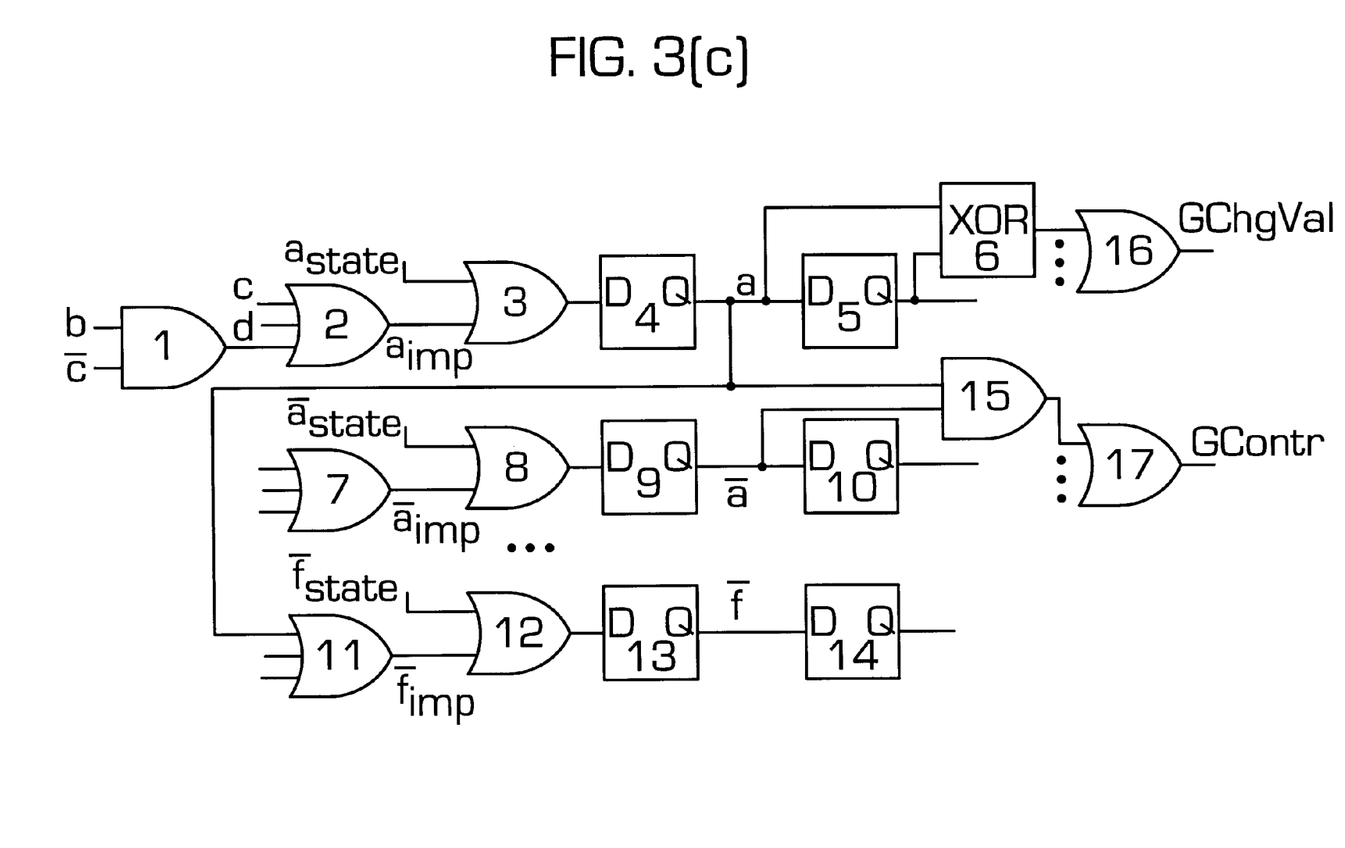

FIG. 3c shows an example of the structure of an implication circuit according to the preferred embodiment for a particular SAT problem. The basic arrangement is similar to that of FIG. 3b, except that flip flops 4, 5, 9, 10, 13 and 14 have been added. Note that with the addition of the flip-flops, the initialization AND gates are no longer needed. The implications propagate through the circuit affecting one level of literals at a time, and the results are then clocked into the flip-flops associated with each literal. On the next clock cycle, these effects are then passed to any literals "downstream." The full effects of one variable assignment are known when the outputs of all the flip-flops stabilize.

That is, considering a single variable, if the corresponding flip flop assumes the same value in two consecutive clock cycles, then it is understood that for now the value is settled, albeit it may change in the future because of further value assignments to other variables down the assignment tree. However, if none of the flip flops has changed in the last two cycles, that means that none would change in any subsequent cycles since all the variable assignments have been settled. Therefore, the process can be stopped at this point.

As the values propagate through the two flip-flops, such as 4 and 5, the output of the two flip flops is input to a solution equality gate, such as gate 6, to provide a local change value signal indicating whether there has been a change between the values in the last two cycles. The local change value from all the variables is ORed by OR gate 16 to provide a global change value signal. For correct operation, the output of all flip flops should be initialized to 0.

Gate 15 is similar to gate 5 of FIG. 3b, and it checks if there is a contradiction for the variable a, i.e., both literals a and $\bar{a}$ have the value 1. The global contradiction signal is formed by Oring all the local contradiction signals (Gate 17). Gates 1–10 and 15 constitute the template that is repeated for each variable and its complement.

As can be understood from the above description, the embodiment of FIG. 3b can be considered as a combinational network, while that of FIG. 3c can be thought of as sequential network, with the task of computing all the implications being done over a number of clock cycles. Also, it should be appreciated that, while in software applications the implications are derived sequentially, the creation of the implication circuitry provides all the implications at one time for the combinational network, and, due to the parallelism, requires only a small number of cycles in the sequential network.

Figure 3D:
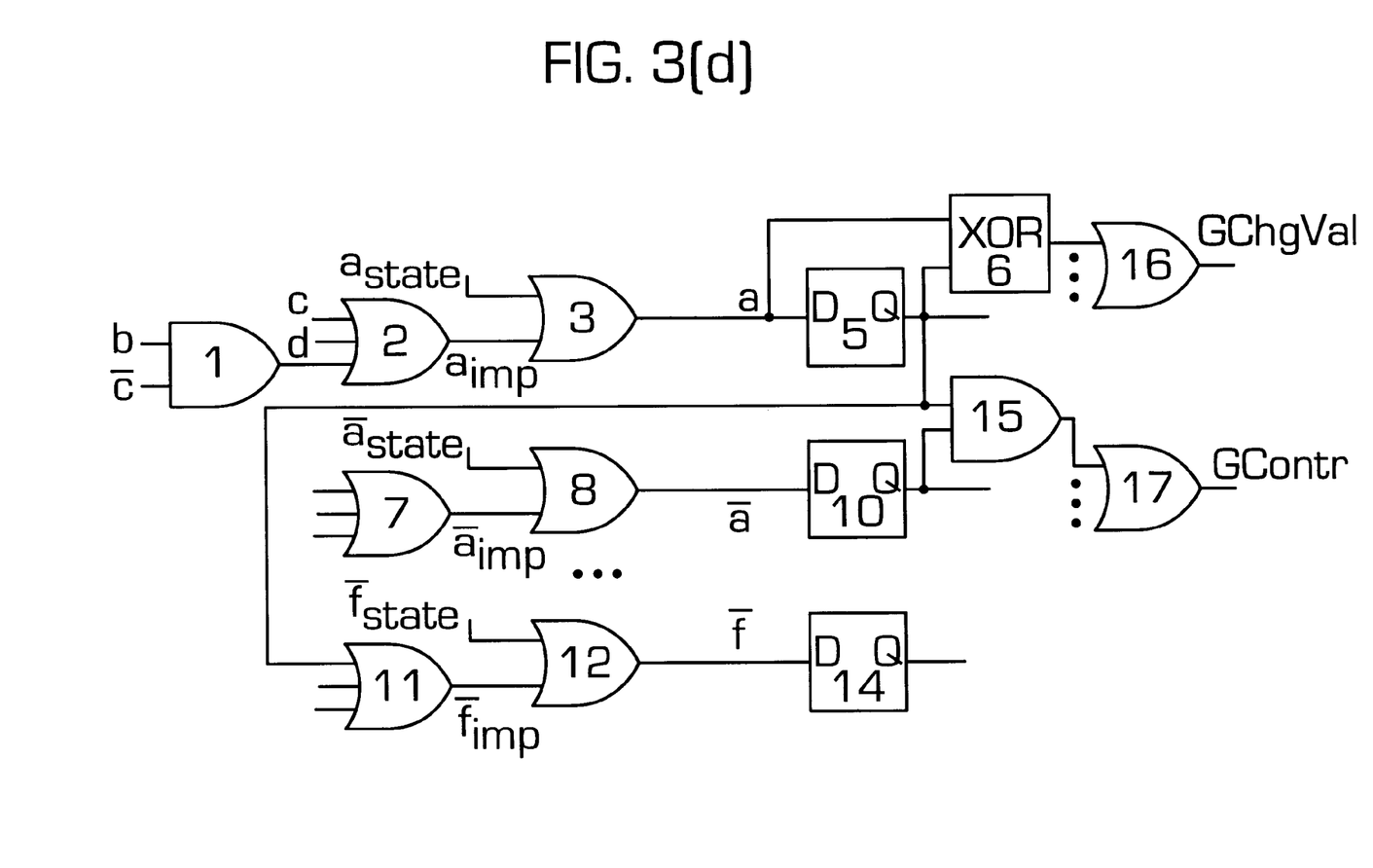

The circuitry of FIG. 3c can be simplified by reducing the number of flip flops. This is depicted in FIG. 3d. The main change from the circuit of FIG. 3c to that of FIG. 3d is that flip flops 4, 9 and 13 have been eliminated. Also, the connection of line from gate 11 has been moved from the input to the output of flip flop 5, and the line to AND gate 15 has been moved from the input to the output of flip flop 10. Other than that, the circuit is similar to that of FIG. 3c.

(ii) The State Machine For The Branch-And-Bound

Figure 4:
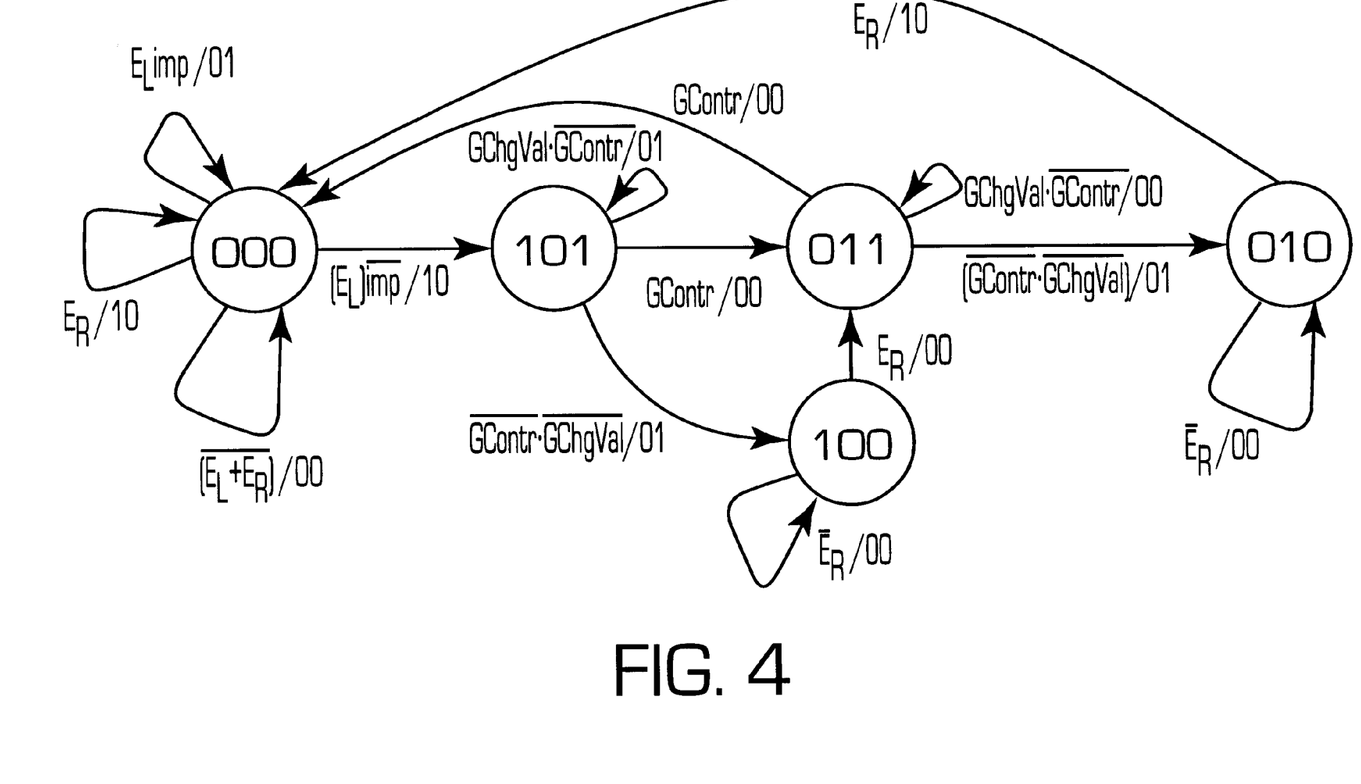
FIG. 4 is a state graph of a state machine according to an embodiment of the present invention.

FIG. 4 is a state diagram which embodies the functionality of the state machine used to implement the branch and bound portion of the SAT algorithm according to the preferred embodiment of the subject invention. For background information regarding state machines, the reader should consult publications treating logic design, such as *Fundamentals of Logic Design*, by Charles H. Roth, Jr. West Publishing Company, 1985. The state machine of the example provided below is implemented as a circuit on the reconfigurable computing card or the emulation board.

Figure 5:
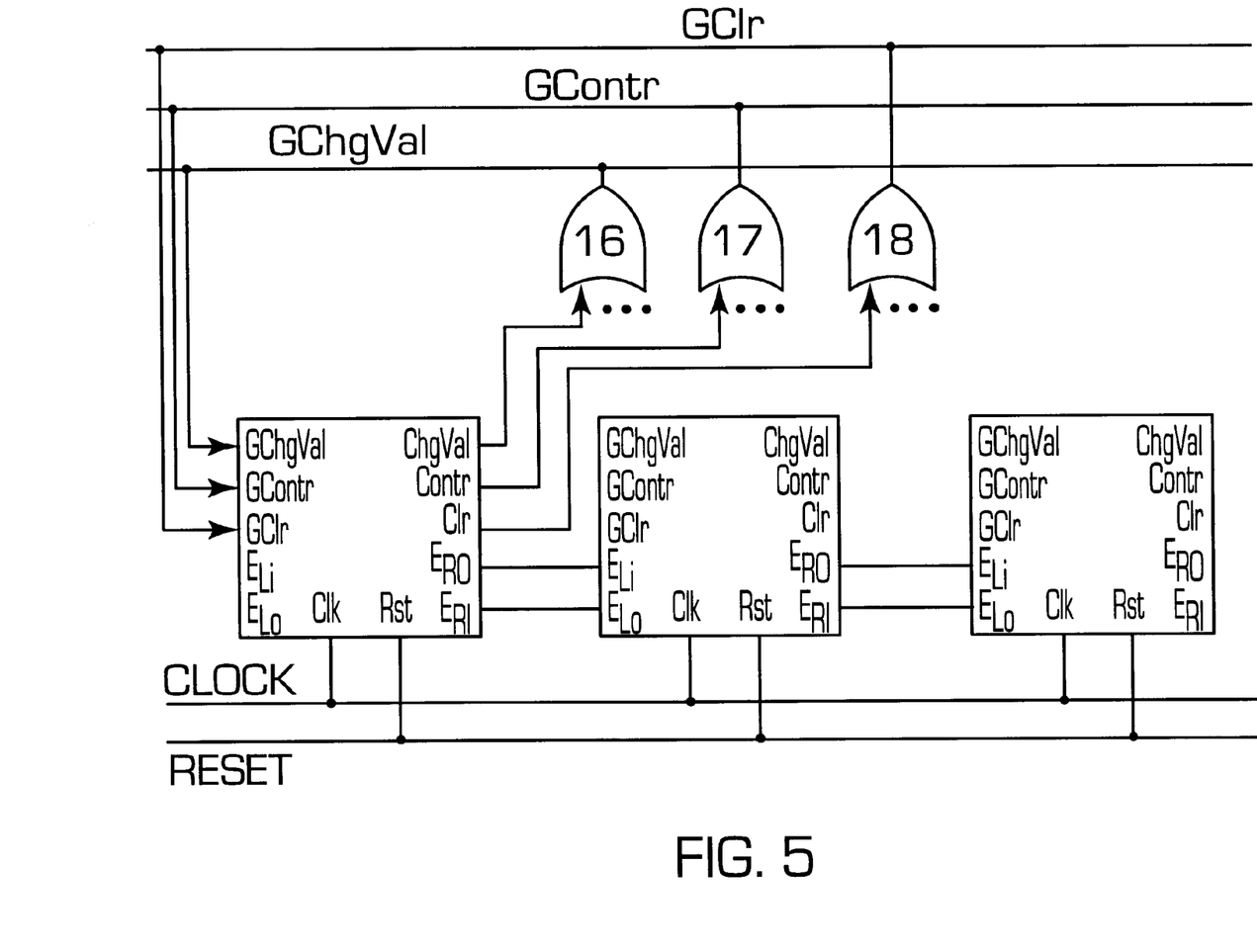
FIG. 5 is a block diagram of the branch and bound state machine implemented in a FPGA according to an embodiment of the present invention.

Before implementing the hardware configuration, an ordering of the variables is determined heuristically according to known methods. For example, the variables can be ordered according to the number of clauses the variables appears in, the first being the variable which appears in the most clauses. As shown in FIG. 5, a separate state machine is implemented for each variable in the CNF formula. Each of the state machines incorporates a corresponding combination implication circuit (not shown in FIG. 5), such as those exemplified in FIGS. 3a–3c. The individual state machines are connected together from left to right, in accordance with the determined ordering of the variables, as shown in FIG. 5.

The states are characterized by three state variables: (i) the value of V, (ii) the value of $\overline{V}_i$, and (iii) a bit indicating whether this state machine is currently active or inactive. This is indicated in FIG. 4 by the three bits in the center of each of the states. Generally, these values may be stored in flip flops (not shown). Separate state variables are required for $V_i$ and $\overline{V}_i$ because they are both 0 until a value is either asserted or implied for them. Each state machine has as common inputs the global clock and reset signals, Ck and Rst respectively; the global contradiction signal, GContr; and the global change value signal, GChgVal. In addition, each state machine receives the enable signals from the block's left and right neighbors, $E_L$ and $E_R$ respectively, which control the branch-and-bound activity. Finally, each state machine also inputs a global clear signal, GClr, for determining when to clear flip flop values.

Each state machine has five outputs: a local contradiction signal, Contr, to be used in forming the global contradiction signal; a local change value signal, ChgVal, to be used in forming the global change value signal; and the enable signals, $E_{RO}$ and $E_{LO}$, to be passed to the block's left and right neighbors. It should be noted that no (imp) input is depicted in FIG. 5. This is because in the preferred embodiment the (imp) signal is generated locally by Oring the $Vi_{imp}$ and $\overline{V}i_{imp}$ signals in each block.

In FIG. 4 the following convention is used: (input)/(output), wherein the output bits correspond to $E_{LO}$ and $E_{RO}$. For example, for the first state, our possible transition, $(E_L)$ (imp)/01, is indicated. This transition is taken when the state machine has as inputs $E_L$ (enable from left) and imp (implied value) set to 1. When the transition is taken, the outputs are set to 0 and 1. The purpose of the imp signals is to allow the state machine to quickly skip through states where a variable's value is already implied.

The solution process starts by having all the variables in their unasserted (both $V_{i\ and\ \overline{V}_i}$ equal to 0) and inactive state. This corresponds to state 000 in FIG. 4. To begin the execution, the left-most variable is activated by asserting $E_{LI}$, the enable-from-the-left signal. Since the contradiction input GContr is zero at this time, this causes a transition from state 000 to 101 in FIG. 4. Namely, the values of this chosen variable are asserted to $V_i=1$ and $\overline{V}_i=0$, as the implied value input is zero, i.e., $\overline{(imp)}$. Also, the right-most digit is changed to 1 to indicate the active state. Once the values are asserted, implications propagate through the logic as discussed in Section i above.

If no contradiction occurs on this assignment, then the state machine proceeds by passing "control" to the next variable to the right. This occurs by asserting the enable output bit, $E_{RO}$, from this variable's state machine, while the contradiction signal GContr remains at zero.

A contradiction occurs when the assigned variable values lead any variable in the circuit to take on non-complementary values (i.e., both Vi and $\overline{V}_i$i equal to 1—see gates 5 and 13 in FIGS. 3b and 3c respectively). If a contradiction indeed occurs, then this is not a valid variable assignment. In this case, the state machine tries the other possible assignment for this variable: $V_i=0$ and $\overline{V}_i=1$. If no contradiction occurs on this second try, then control is passed to the right, as above. If a contradiction also occurs on this second try, then backtracking is required, because no other assignments are possible for this variable. In this case, the variable is returned to its unasserted (0,0) values, and control is passed to the left. That is, $E_{LO}$ is asserted.

If at any point a variable's value has already been implied by a previous setting, then control skips to the next variable, without new settings being attempted. This avoids redundant work in identifying the appropriate, non-contradictory settings for this variable.

The system and method of the present invention improves performance for a significant set of SAT problems. In order to evaluate the performance potential of the configurable-hardware-based approach according to the invention (referred to as C-SAT in the tables and discussions), it was compared against GRASP, a high performance software-based SAT solver according to the prior art disclosed by Silva et al., cited above. The GRASP program is currently one of the fastest software SAT implementations available. The GRASP runtimes reported herein were collected on a SUN-S5FX1-70 workstation.

For comparison, simulated runtimes for C-SAT are reported herein. The inventors wrote a C program that acts as a specialized simulator for the inventive process. In the software, the SAT clauses are stored in a sparse matrix, and the branch-and-bound functionality described in section ii above is simulated. As the problem is solved, the SAT states visited and the total cycles required were recorded. Each state corresponds to a node on the branch-and-bound tree.

The performance evaluations considered benchmarks from the DIMACS SAT benchmark suite as well as problems from the UCSC benchmarks (Note, DIMACS, Dimacs challenge benchmarks and ucsc benchmarks, are available at ftp://Dimacs.Rutgers.EDU/pub/challenge/sat/benchm arks/cnf). There are a total of 238 benchmark SAT problems in these suites. Of these, the inventors focused on the 125 for which the software simulations (not the hardware they are simulating) run in 1 hour or less. Since the software simulation of the configurable hardware is 100x–1000x slower than the configurable hardware itself, it is anticipated that of the 113 remaining problems, several more would be solvable in "reasonable" time by the actual configurable hardware. For comparison, GRASP is able to complete 207 of the problems in less than 1 hour. There are 3 SAT problems for which GRASP aborts but the software simulator found a solution. Thus, there are a total of 122 problems for which results from both approaches are available. The 122 problems are discussed hereinbelow.

Table 1 gives detailed performance numbers for the 35 problems with the longest GRASP runtimes. The problems are ordered according to their GRASP runtimes, and the ones shown correspond to GRASP runtimes of 0.4 seconds or more. For each SAT problem, the table gives five numbers. The column labeled C-SAT States reports the number of states visited in the hardware simulation algorithm. The second column, labeled C-SAT Cycles gives the number of FPGA cycles required. Since the configurable hardware may remain in a particular state for several cycles, the number of cycles required is always greater than or equal to the number of states visited.

In order to compare against the measured GRASP runtimes, cycle counts need to be converted to time measurements; that is, a means of estimating the cycle time of the configurable hardware circuit is needed. For this table, an FPGA clock rate of 10 MHz is assumed. Using a 100 ns cycle time, FPGA computation times were calculated for the SAT problems shown. These times do not include the time required to configure the FPGA. Here, the inventors minimized the impact of configuration time by focusing on SAT problems with long enough software runtimes that configuration (on the order of a millisecond) should not have a large impact.

As Table 1 shows, the number of cycles required to solve the problem in hardware is considerably smaller than that for software for all but one problem. For applications where configurable hardware is beneficial, the speedup factors range from 4x to more than 34000x. If we consider the full benchmark suite, there are additional problems where GRASP outperforms C-SAT, but overall, C-SAT outperforms GRASP on a sizable set of difficult SAT problems. For this reason, C-SAT should be considered as an important component in a suite of SAT-solving approaches. Therefore, it should be appreciated that the invention is advantageous in that depending on the complexity of the problem, one may use either the C-SAT software simulation or the configurable hardware system to achieve accelerated SAT implementation.

One particular use of SAT is to automatically derive test patterns. For example, one may use SAT to derive test pattern to detect a fault in a combinational circuit. Such use is described in the Larrabee publications cited above; however, a short example will also be provided herein.

Figure 6:
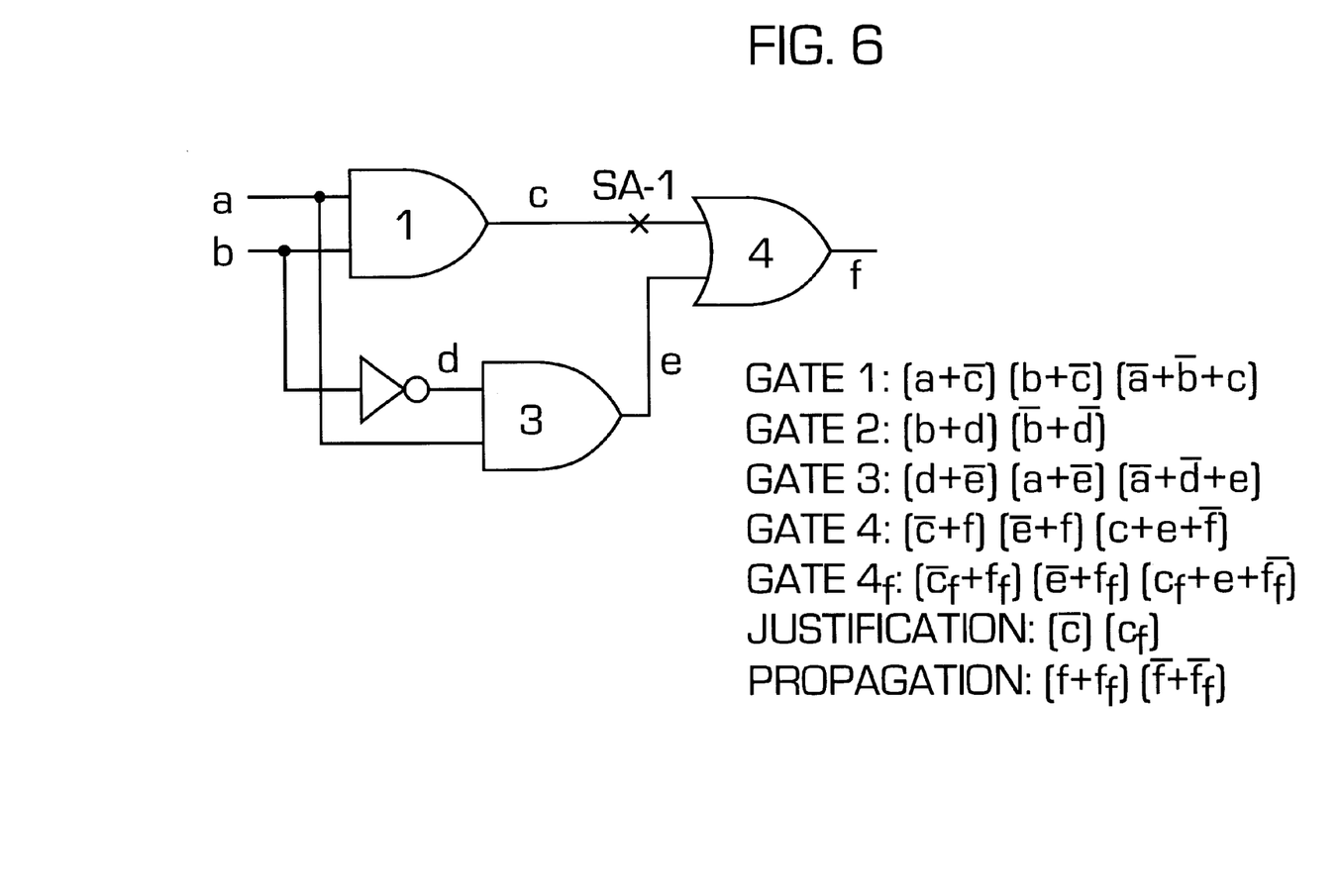
FIG. 6 is a logic diagram depicting an exemplary logic circuit having a stuck-at-1 fault between gates 1 and 4.

With reference to FIG. 6, an example will be discussed demonstrating how a SAT solver determines a satisfying assignment for a particular CNF formula. In this particular example, a test pattern is developed in order to test a stuck-at-1 fault indicated between gates 1 and 4 in FIG. 6. That is, the goal is to determine the appropriate values for the variables a and b so that the output f will indicate whether a stuck-at-1 fault exists between gates 1 and 4.

First, the clauses representing all the relationships must be developed in CNF. The derived clauses are given to the right of the circuit diagram. For each gate, various clauses are derived to describe the relationships between the gate's inputs and outputs. These clauses contain all the valid input-output combinations of each gate. For example, AND gate 1 has inputs a and b and output c. Therefore, for gate 1 two 2-clauses and one 3-clause are derived: $(a+\bar{c})$ $(b+\bar{c})$ $(\bar{a}+\bar{b}+c)$. It should be appreciated that every 2-clause indicates the dependency of the variables in the clause. Thus, for example, the 2-clause $(a+\bar{c})$ indicates the dependencies between the input a and the output c, i.e., $a=0 \rightarrow c=0$, and $c=1 \rightarrow a=1$.

When all the clauses describing the valid relationship between the inputs and outputs of the circuit gates have been derived, one needs to derive clauses relating to the fault to be tested. For that purpose, new clauses are derived describing the different values of the variables concerning circuit elements that are "downstream" of the fault—in this example gate 4. New variables, $C_f$ and $f_f$ are introduced, which designate the faulty counterparts of variables c and f. The relationships concerning the new variables and gate 4 are indicated in FIG. 6 as gate $4_f$.

The next step is to derive clauses corresponding to the polarity of the fault. In this example, we set out to check a stuck-at-1 fault on the value c. Therefore, faulty c, i.e., $C_f$, must assume the value 1 and the input vector must justify the opposite value for c, i.e., c=0. Thus, the justification clause is $(\bar{c})$ $(c_f)$.

Finally, in order to be able to distinguish between the faulty and fault-free circuits, the final output of the circuit should be different for the respective circuits. Therefore, f and $f_f$ must assume different values, as shown in the propagation clauses of FIG. 6. The product of all the above derived clauses is the CNF formula which must be satisfied by the proper assignment of values to the variables, i.e., we need to determine a vector which would cause the CNF to evaluate to 1.

TABLE 1

Hardware and software performance for SAT problems with significant software runtimes

| SAT Problem | C-SAT States | C-SAT Cycles | C-SAT Time (s) | GRASP Time (s) | Speedup |
| --- | --- | --- | --- | --- | --- |
| par16-5c | 103107 | 1672436 | 0.17 | >3600 | >21000 |
| par16-2-c | 59960 | 1053769 | 0.1 | >3600 | >34000 |
| hole10 | 141745218 | 1264034290 | 126.4 | >3600 | >28 |
| hole9 | 9825028 | 82817258 | 8.3 | 3182.9 | 384 |
| par16-5 | 109665 | 3918147 | 0.39 | 710.19 | 1813 |
| par16-1-c | 105121 | 1530835 | 0.15 | 295.07 | 5278 |
| par16-4-c | 36063 | 559387 | 0.056 | 222.63 | 3983 |
| par16-2 | 56616 | 2055522 | 0.2 | 145.83 | 710 |
| par16-1 | 105633 | 3750233 | 0.38 | 136 | 363 |
| hole8 | 756686 | 5999506 | 0.6 | 66.45 | 111 |

TABLE 1-continued

Hardware and software performance for SAT problems with significant software runtimes

| SAT Problem | C-SAT States | C-SAT Cycles | C-SAT Time (s) | GRASP Time (s) | Speedup |
|---|---|---|---|---|---|
| par16-4 | 23519 | 900043 | 0.09 | 52.15 | 579 |
| par16-3 | 35627 | 1280108 | 0.13 | 37.6 | 294 |
| par16-3-c | 36139 | 569844 | 0.057 | 28.36 | 498 |
| hole7 | 65560 | 485984 | 0.048 | 14.82 | 305 |
| jnh16 | 13068 | 121031 | 0.012 | 7.04 | 587 |
| hole6 | 6490 | 44634 | 0.004 | 1.63 | 365 |
| jnh306 | 5800 | 49336 | 0.0049 | 1.59 | 322 |
| ii8b3 | 3410 | 24107 | 0.0024 | 1.46 | 606 |
| jnh204 | 1032 | 9484 | 0.00095 | 1.19 | 1255 |
| ii8b2 | 26788 | 183228 | 0.018 | 0.93 | 51 |
| jnh220 | 229 | 2136 | 0.00021 | 0.9 | 4213 |
| jnh3 | 3038 | 25666 | 0.0026 | 0.73 | 284 |
| jnh207 | 582 | 5707 | 0.00057 | 0.63 | 1105 |
| jnh6 | 1484 | 12594 | 0.0012 | 0.61 | 508 |
| aim-200-6_0-yes1-1 | 180778 | 1445448 | 0.14 | 0.6 | 4 |
| jnh212 | 21700 | 186674 | 0.019 | 0.58 | 31 |
| jnh206 | 978 | 9971 | 0.001 | 0.49 | 491 |
| jnh308 | 272 | 2516 | 0.00025 | 0.48 | 1920 |
| pret60_40 | 5541886 | 50797213 | 5.1 | 0.47 | 0.08 |
| jnh17 | 103 | 1130 | 0.0001 | 0.47 | 4159 |
| jnh11 | 4280 | 34791 | 0.0035 | 0.43 | 124 |
| jnh214 | 878 | 7578 | 0.00076 | 0.42 | 294 |
| jnh216 | 1128 | 9671 | 0.00097 | 0.4 | 413 |
| jnh18 | 2672 | 22694 | 0.002 | 0.4 | 116 |
| jnh15 | 2002 | 14981 | 0.0015 | 0.4 | 267 |

In order to determine whether the space requirements associated with the instance-specific SAT circuits of the invention can be met by current or soon-available FPGA hardware, the inventors have estimated the size of FPGAs required to solve the problems in the DIMACS SAT benchmarks and the UCSC test pattern generation benchmarks. Although the design is largely independent of the type of FPGA used, for concreteness we focus here on a mapping to Xilinx XC4000-series parts (Xilinx Corp. *The Programmable Logic Data Book*, Xilinx Corp. San Jose, Calif., 1994). The CLB in these parts contain two four-input lookup tables and two flip-flops. They can implement any two four-input functions, any five-input functions, and some functions of up to nine inputs.

Two methods have been used to estimate the hardware size required for the system according to the preferred embodiment of the subject invention. First, for all the circuits the inventors have run a custom-written size estimator that counts CLBs based on the number of variables in the SAT problem and on the particular structure of the SAT clauses. The estimator calculates the size of the implication logic required, the number of state machines, and the size of the global contradiction and ChgVal logic. Table 2 lists the CLB requirements for the 35 DIMACS and UCSC SAT problems listed in Table 1.

To validate these estimations, the inventors also generated VHDL (hardware description language) code for the problems and used the Synopsys FPGA synthesis tools to compile some instances to an FPGA netlist. Table 3 shows the results for these circuits. These results show that the estimator developed by the inventors does a reasonable job at capturing the hardware requirements of the different SAT clauses. For the tested cases, the estimates are within 20% of the Synopsys numbers and tend to be more conservative (i.e. overestimates) on larger circuits.

For the 35 time-consuming SAT problems, the hardware requirements range from 462 CLBs up to 12,537 CLBs. Considering the full suite of DIMACS problems, the inventors have measured CLB requirements of over 350,000 for the ii32c4 problem. For reference, Xilinx sells 4000-series FPGAs with roughly 1300 CLBs in volume, and currently has 4000-series parts that range up to 2300 CLBs. While the inventive method for SAT-solving of smaller problems would be easily implementable within current FPGAs, the larger and more difficult problems exceed current capacities by a factor of 10 or more. Nevertheless, the system and method according to the invention are advantageous in that it confirms that FPGA growth is likely to outstrip the growth of "interesting" application sizes in this domain. Notably, it is expected that 1 million gate FPGAs will be built in three to five years (see, J. Rose and D. Hill, *Architectural and Physical Design Challenges for One Million Gate FPGAs and Beyond*, Proc. 1997 ACM/SIGDA Fifth International Symposium on Field-Programmable Gate Arrays, February 1997), and many interesting SAT problems will comfortably fit on FPGAs of this size.

TABLE 2

Estimated CLB counts for FPGA solutions

| SAT Problem | #Variables | #Clauses | #CLBs (Using our estimator) |
|---|---|---|---|
| par16-5c | 341 | 1360 | 4653 |
| par16-2-c | 349 | 1392 | 4765 |
| hole10 | 110 | 561 | 1430 |
| hole9 | 90 | 415 | 1170 |
| par16-5 | 1015 | 3358 | 12495 |
| par16-1-c | 317 | 1264 | 4311 |
| par16-4-c | 324 | 1292 | 4412 |
| par16-2 | 1015 | 3374 | 12537 |
| par16-1 | 1015 | 3310 | 12431 |
| hole8 | 72 | 297 | 864 |
| par16-4 | 1015 | 3324 | 12455 |
| par16-3 | 1015 | 3344 | 12491 |
| par16-3-c | 334 | 1332 | 4554 |
| hole7 | 56 | 204 | 616 |
| jnh16 | 100 | 850 | 3764 |
| hole6 | 42 | 133 | 462 |
| jnh306 | 100 | 900 | 3923 |

TABLE 2-continued

Estimated CLB counts for FPGA solutions

| SAT Problem | #Variables | #Clauses | #CLBs (Using our estimator) |
|---|---|---|---|
| ii8b3 | 816 | 6108 | 11772 |
| jnh204 | 100 | 800 | 3577 |
| ii8b2 | 576 | 4088 | 8142 |
| jnh220 | 100 | 800 | 3566 |
| jnh3 | 100 | 850 | 3807 |
| jnh207 | 100 | 800 | 3598 |
| jnh6 | 100 | 850 | 3758 |
| aim-200-6_-yes1-1 | 200 | 1200 | 3000 |
| jnh212 | 100 | 800 | 3601 |
| jnh206 | 100 | 800 | 3606 |
| jnh308 | 100 | 900 | 3926 |
| pret60_40 | 60 | 160 | 780 |
| jnh17 | 100 | 850 | 3713 |
| jnh11 | 100 | 850 | 3717 |
| jnh214 | 100 | 800 | 3596 |
| jnh216 | 100 | 800 | 3595 |
| jnh18 | 100 | 850 | 3801 |
| jnh15 | 100 | 850 | 3729 |

TABLE 3

Comparison of our hardware estimates to those generated by Synopsys tools.

| SAT Problem | #CLBs (Our estimate) | #CLBs (Synopsys estimate) |
|---|---|---|
| hole10 | 1430 | 1383 |
| hole9 | 1170 | 1133 |
| hole8 | 864 | 889 |
| hole7 | 616 | 687 |
| hole6 | 462 | 517 |
| jnh16 | 3764 | 3010 |
| jnh204 | 3577 | 2900 |
| pret60_40 | 780 | 780 |

The inventors' choice of a 10 MHz clock rate for the preceding performance estimates was a conservative one based on Synopsys static timing analysis. For all the circuits listed in Table 3, timing simulations indicated that a 100 ns clock cycle time had at least 46 ns of slack. Considering that data only, a clock rate of 10 MHz may seem unduly conservative, but additional simulations on larger circuits indicated that cycle time requirements increased slightly with the number of variables in the circuits. The inventors have validated the Synopsys static timing estimates against Xilinx cycle time estimators using a small 25-variable SAT circuit that would fit on a single Xilinx 4010 FPGA. For that small circuit, the Xilinx tools (which include additional timing effects such as routing delays) gave cycle time estimates of 7 MHz. Thus, overall the inventors' choice of a 10 MHz clock rate is an accurate, yet conservative, estimate given the currently-available data.

The results discussed thus far demonstrate the advantage of using the inventive configurable hardware system and method in many difficult-to-solve SAT problems. The inventors have also implemented a simulation of the algorithm disclosed by Suyama et al., cited above, and noted that the algorithm of Suyama et al. visits at least an order of magnitude more states than the inventive system before finding a solution. This demonstrates superior results achieved by the inventive configurable hardware mapping.

Since SAT solvers focus on efficient mechanisms for exploring the search space, the key implementation characteristics revolve around the default search order and available mechanisms for deviating from this default as the problem runs. Notably, the inventive C-SAT implementation uses a static ordering of the variables in the search space. That is, according to the preferred embodiment, the variable-ordering heuristicly produces a static ordering of the variables based on the number of appearances of each variable in the CNF expression (in both complemented and uncomplemented forms). Therefore, the inventive system considers the frequently-appearing variables first. However, it should be appreciated by those skilled in the art that other heuristic can be implemented instead.

For example, GRASP and other prior art software SAT approaches, are able to reorder variables on the fly. Similar re-ordering of variables in the inventive C-SAT will require partial reconfiguration of the hardware. While such reconfiguration are possible in current technology, the inventors note that reconfiguration overhead may outweigh its potential benefits in this case. Thus, in the preferred embodiment a good initial variable ordering is preferable over a dynamic ordering.

The preferred embodiment exemplified in FIGS. 4 and 5 employs linear back tracking. That is, the system of the preferred embodiment responds to detected contradictions by backtracking to the previous state, and attempting to clear the contradiction at that level by trying the variable's other value. If both values have led to contradictions, then one must backtrack to the previous level. However, those skilled in the art would appreciate that non-linear back tracking can also be employed. For example, GRASP employs non-linear backtracking to avoid some of the overhead of the simple backtracking strategies by "diagnosing" the causes of the contradiction and possibly backtracking further up the branch-and-bound tree than in linear backtracking. Therefore, the implementation of non-linear backtracking in the inventive system essentially requires that the inventive system be able to send Enable signals to blocks other than the left and right near-neighbors. Thus, by modifying the shift-register-style control shown in FIG. 5 and adding Enable signal lines to more "removed" neighbors, one may implement non-linear backtracking similar to that employed by GRASP.

The implications of instance-specific applications in configurable hardware should be appreciated in a broad sense. The emergence of high levels of integration in field-programmable logic opens up exciting new application areas for configurable computing. With 0.25 $\mu$m CMOS processes, the expected integration is 250K gates/FPGA. As feature sizes shrink even further, at 0.13 $\mu$m 1M gate FPGAs will be feasible by the year 2001. The subject invention provides one method for effectively harnessing the capabilities of programmable logic arrays at these levels of integration.

Another major application area for configurable hardware focuses on "problem-specific" mapping of applications to FPGAs (see, e.g., the P. Athanas et al. and M. Gokhale et al. articles cited above). This domain exploits an FPGA's ability to customize computation for a particular program, but the chosen hardware configuration does not change for input data sets. That is, the problem is mapped onto the FPGA, and various aspects are tested by changing the values of the input signals. As hardware integration increases, this "problem-specific" compilation onto programmable logic will have higher levels of available parallelism, but there will not be a qualitative shift in the types of problems that are feasible.

In contrast, the high levels of integration will significantly expand the opportunities for using configurable hardware in an "instance-specific" way as is disclosed by the subject specification. In an instance-specific mapping, the FPGA is configured especially for an application with a particular input data set. The inventors' C-SAT application falls into this category because the hardware described herein is customized to a particular CNF formula, although all instantiations follow a common design template.

In general, instance-specific compilation did not make much sense with lower levels of intergration. For problems of interesting size, any instance-specific logic mapping would require far more gates than were available (even on a board/emulation system of FPGAs). Some of Table 2's hardware estimates illustrate this quite clearly. However, with the increasing densities this will gradually become less of a problem, because trends indicate that FPGA capacities will often scale more quickly than SAT problem sizes.

For example, considering the SAT problems coming from ATPG, we see that their sizes do not increase commensurately with increasing circuit densities. ATPG SAT sizes are related to the size of a logic cone for a particular fault and this does not necessarily scale with density. Rather, it is the total number of cones (and therefore the number of SAT problems) which will increase significantly. For SAT problems arising from other sources such as logical resolution in AI there is no reason to expect the problem sizes to increase as a result of increasing circuit densities. Thus, applications of instance-specific compilation should become dramatically more feasible with rising levels of hardware integration.

The C-SAT system according to the present invention implements the larger and more complex branch and bound algorithm onto programmable logic. The motivation is to minimize communication overhead between a host processor and the C-SAT hardware, and to explore the implementation of large instance-specific problems. The data requirements for the C-SAT are specific to the problem instance and are thus dynamic. By using instance-specific compilation, this dynamic data requirement is converted to a static program requirement. This is a general characteristic of problems for which instance-specific compilation is preferable to problem-specific compilation.

In order to be easily compiled onto programmable logic, the core combinational computation (computation per clock cycle) must take advantage of the large amount of logical parallelism available. That is true for configurable computing in general. In addition, there should be a fairly direct, template-driven mapping from application structures onto logic. In C-SAT, there is a direct mapping for each SAT variable and clause onto logic. While there is no fundamental reason to expect this to be universally true, such direct mappings have intuitive appeal. They aid in keeping the size of the logic proportional to that of the instance, and they also help keep the relationship between the instance and the computational engine relatively obvious.

As can be appreciated from the above disclosure, the present invention provide at least two advantages. First, it provides a system design for instance-specific Boolean satisfiability solutions based on a configurable hardware implementation. It is expected that the inventive system will provide speedups of one to three orders of magnitude compared to prior art software SAT solutions, assuming relatively conservative estimates of technology differences between custom processors and configurable hardware.

Second the inventive SAT-solver provides a case study of a class of instance-specific configurable hardware applications. These applications harness the reconfigurability of FPGAs aggressively by modifying hardware designs (not just input data) for each problem/data set being solved. Because of the complexity of such designs, they are likely to be among the first applications to make full use of the million-gate FPGAs expected in the next 3 to 5 years. Furthermore, their amenability to parameterized, automated design makes it relatively easy to compile configurations for them.

Although the invention has been described and shown in terms of a preferred embodiment thereof, it will be understood by those skilled in the art that changes in form and detail may be made therein without departing from the spirit and scope of the invention as defined in the appended claims.

What is claimed is:

1. A method for deriving a satisfying variable assignment for variables of a Boolean formula, comprising:

deriving a conjunctive normal form representation of the Boolean formula;

generating at least one state machine in the configurable logic circuit for sequentially assigning values to the variables and performing backtrack operations based on the assigned values and determining whether a conflict occurs;

generating a plurality of implication circuits corresponding to said conjunctive normal form representation in a configurable logic circuit, wherein each implication circuit is assigned to a literal that corresponds to a variable of the Boolean formula using the conjunctive normal form representation, wherein each generated implication circuit comprises:

a literal value output;

an assigned literal input that receives an assigned value from the state machine; and an implied literal input that receives at least one of the literal value outputs from the plurality of implication circuits;

generating a plurality of local contradiction gates to provide local contradiction signals indicating whether a contradiction exists between the two literals of a particular variable, wherein the number of local contradiction gates is equal to the number of variables; and defining the assigned values as the satisfying variable assignment for the variables of the Boolean formula, when all of the variables have been assigned values which do not result in conflict.

2. The method of claim 1, wherein the configurable logic circuit comprises at least one field programmable gate array.

3. The method of claim 2, wherein the configurable logic circuit further comprises at least one programmable logic device.

4. A method for deriving a set of value assignments for a plurality of inputs to test at least one stuck-at fault of a logic circuit, comprising:

deriving a conjunctive normal form representation of the at least one stuck-at fault in the logic circuit to be tested;

generating at least one state machine in the configurable logic circuit for sequentially assigning values to the variables and performing backtrack operations based on the assigned values and determining whether a conflict occurs;

generating a plurality of implication circuits corresponding to said conjunctive normal form representation in a configurable logic circuit, wherein each implication circuit is assigned to a literal that corresponds to one of the plurality of inputs using the conjunctive normal form representation, wherein each generated implication circuit comprises:

a literal value output;

an assigned literal input that receives an assigned value from the state machine; and an implied literal input that receives at least one of the literal value outputs from the plurality of implication circuits;

generating a plurality of local contradiction gates to provide local contradiction signals indicating whether a contradiction exists between the two literals of a particular variable, wherein the number of local contradiction gates is equal to the number of variables; and defining the assigned values as the proper values assignment for the plurality of inputs that will test the at least one stuck-at fault when all of the plurality of inputs have been assigned values which do not result in a conflict.

5. The method of claim 4, wherein the configurable logic circuit comprises at least one field programmable gate array.

6. The method of claim 5, wherein the configurable logic circuit further comprises at least one programmable logic device.

7. The method of claim 4, wherein the step of deriving the conjunctive normal form further comprises deriving clauses indicating the polarity of the at least one stuck-at fault.

8. A configurable hardware system for SAT solver implementation of a plurality of Boolean variables, the configurable hardware system comprising:

at least one state machine circuit for sequentially assigning values to the plurality of variables and performing backtrack operations based on the assigned values and determining whether a conflict occurs;

a plurality of implication circuits in a configurable logic circuit, each implication circuit comprising:

a literal value output;

an assigned literal input wherein the implication circuit receives an assigned value from the state machine; and an implied literal input that receives at least one of the literal value outputs from the plurality of implication circuits;

wherein each literal of the plurality of variables is exclusively assigned to one of the implication circuits;

a plurality of local contradiction gates to provide local contradiction signals indicating whether a contradiction exists between the two literals of a particular variable, wherein the number of local contradiction gates is equal to the number of variables; and wherein when the at least one state machine assigns values to all the variables and determines that no conflict results, the configurable hardware system indicates that the assigned values are proper for the plurality of variables.

9. The configurable hardware system of claim 8, wherein the at least one state machine circuit comprises a plurality of state machines corresponding to the plurality of variables.

10. The configurable hardware system of claim 8, wherein the at least one implication circuit is a combinational circuit.

11. The configurable hardware system of claim 10, wherein the at least one implication circuit further comprises a first flip flop circuit and a second flip flop circuit for determining whether a corresponding variable assignment has been settled.

12. The configurable hardware system of claim 11, further comprising a global change value gate linked to a data input and a data output of the second flip flop, wherein the global change value gate outputs a signal indicating when assignments of the variables have been changed.

13. The configurable hardware system of claim 8, further comprising a global contradiction gate, wherein the global contradiction gate uses the output of each local contradiction gates to determine if there is a contradiction in the literal values of any one variable.

14. An implication circuit executing a backtrack procedure for a variable, comprising:

a first gate outputting an implied value of the variable;

a second gate connected to the output of the first gate thereby receiving said implied value, the second gate further receiving an input defining an assigned value for the variable and outputting the logical result of the implied value and the assigned value;

a third gate connected to the output of the second gate and an output coupled to a first global gate for indicating whether the value of the variable has settled; and a first flip flop circuit having an input connected to the second gate and an output coupled to a second global gate.

15. The implication circuit of claim 14, further comprising:

a second flip flop interposed between the second gate and the first flip flop, the second flip flop providing output to the first flip flop.

* * * * *